United States Patent
Frank

(10) Patent No.: US 8,541,867 B2
(45) Date of Patent: Sep. 24, 2013

(54) METAL INSULATOR METAL STRUCTURE WITH REMOTE OXYGEN SCAVENGING

(75) Inventor: Martin M. Frank, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 13/171,044

(22) Filed: Jun. 28, 2011

(65) Prior Publication Data
US 2013/0001743 A1    Jan. 3, 2013

(51) Int. Cl.
*H01L 21/02* (2006.01)
*H01L 21/20* (2006.01)

(52) U.S. Cl.
USPC .............. 257/532; 438/396; 257/E21.008; 257/E21.011; 257/E21.021; 257/E29.343

(58) Field of Classification Search
USPC .......... 438/396; 257/532, E21.008, E21.011, 257/E21.021, E29.343
See application file for complete search history.

(56) References Cited

U.S. PATENT DOCUMENTS

| | | | |
|---|---|---|---|
| 6,268,258 B1 * | 7/2001 | Joo et al. | 438/381 |
| 6,444,592 B1 | 9/2002 | Ballantine et al. | |
| 6,528,374 B2 | 3/2003 | Bojarczuk, Jr. et al. | |
| 6,890,807 B2 | 5/2005 | Chau et al. | |
| 7,226,831 B1 | 6/2007 | Metz et al. | |
| 7,750,418 B2 | 7/2010 | Chudzik et al. | |
| 7,989,902 B2 | 8/2011 | Ando et al. | |
| 2009/0269939 A1 | 10/2009 | Sprey | |
| 2009/0316331 A1 * | 12/2009 | Nakabayashi | 361/311 |
| 2010/0133501 A1 * | 6/2010 | Sakamoto et al. | 257/4 |
| 2010/0244206 A1 | 9/2010 | Bu et al. | |
| 2010/0320547 A1 | 12/2010 | Ando et al. | |
| 2011/0012210 A1 | 1/2011 | Xu | |
| 2011/0207280 A1 | 8/2011 | Ando et al. | |
| 2011/0298053 A1 | 12/2011 | Zhong et al. | |

OTHER PUBLICATIONS

M.M. Frank, "High-k/metal Gate Innovations Enabling Continued CMOS Scaling," Proceedings of the ESSCIRC, Sep. 12-16, 2011, pp. 50-58.
B. Govoreanu et al., "Performance and Reliability of HfAlOx-based Interpoly Dielectrics for Floating-gate Flash Memory," Solid-State Electronics, vol. 52, Issue 4, Apr. 2008, pp. 557-563.
B. Govoreanu, et al., "The Flash Memory for the Nodes to Come: Material Issues from a Device Perspective," ECS Transactions, 19 (2) 649-668 (2009), 10.1149/1.3122122 The Electrochemical Society.
Jan Van Houdt, "Charge-based Nonvolatile Memory: Near the End of the Roadmap?" Current Applied Physics 11 (2011) e21-e24, Current Applied Physics, journal homepage: www.elsevier.com/locate/cap, Memory Devices Design Group, Imec, Kapeldreef 75, B-3001 Leuven, Belgium.

(Continued)

*Primary Examiner* — Kevin Parendo
(74) *Attorney, Agent, or Firm* — Cantor Colburn LLP; Vazken Alexanian

(57) ABSTRACT

A structure includes a first metallic electrode, a dielectric film formed over the first metallic electrode, and a second metallic electrode formed over the dielectric film. The second metallic electrode includes an oxygen scavenging material. The oxygen scavenging material is selected such that an oxygen density decreases in a region between the first metallic electrode and the second metallic electrode responsive to elevating a temperature of the first metallic electrode, the dielectric film, and the second metallic electrode.

24 Claims, 9 Drawing Sheets

(56) References Cited

OTHER PUBLICATIONS

H.S. Jung et al., "A Highly Manufacturable MIPS (Metal Inserted Poly-Si Stack) Technology with Novel Threshold with Novel Threshold Voltage Control," Digest of Technical Papers, 2005 Symposium on VLSI Technology, Jun. 14-16, 2005, pp. 232-233.

C. Ludwig, "Advances in Flash Memory Devices," Materials Science-Poland, vol. 28, No. 1, 2010.

W. Weinreich, et al., "Impact of Interface Variations on J-V and C-V Polarity Asymmetry of MIM Capacitors with Amorphous and Crystalline Zr(1-x)AlxO2 Films," Microelectronic Engineering 86 (2009) 1826-1829, journal homepage: www.elsevier.com/locate/mee, Microelectronic Engineering.

Wenger et al., "The Role of the HfO2-TiN Interface in Capacitance-Voltage Nonlinearity of Metal-Insulator-Metal Capacitors," Thin Solid Films 517 (2009) 6334-6336, journal homepage: www.elsevier.com/locate/tsf.

Ando, et al., "Understanding Mobility Mechanisms in Extremely Scaled HfO2 (EOT 0.42 nm) Using Remote Interfacial Layer Scavenging Technique abd Vt-Tuning Dipoles with Gate-First Process", 2009 IEEE International Electron Devices Meeting (IEDM), Dec. 7-9, 2009; pp. 423-426.

Ando, et al., "Ultimate EOT Scaling (<5A) Using Hf-Based High-k Gate Dielectrics and Impact on Carrier Mobility," ECS Trans., vol. 28, No. 1. 2010; pp. 115-123.

Lee, et al.. "HfOx Bipolar Resistive Memory Robust Endurance Using AlCu as Buffer Electrode", IEEE Electron Device Letters, vol. 30, No. 7, 2009; pp. 703-705.

Ogawa, et al., "0.6nm-EOT High-k Gate Stacks with HfSiOx Interfacial Layer Grown by Solid-Phase Reaction Between HfO2 and Si Substrate", Microelectronic Engineering, vol. 84, Issues 9-10, Sep.-Oct. 2007; pp. 1861-1864.

Wu, et al., "Highly Stable SrZrO3 Bipolar Resistive Switching Memory by Ti Modulation Layer", ECS Trans., vol. 28, No. 2, 2010; pp. 411-420.

U.S. Appl. No. 13/171,044; Titled: Metal Insulator Metal Structure with Remote Oxygen Scavenging, Inventor: M. Frank, filed Jun. 28, 2011; published Jan. 3, 2013.

\* cited by examiner

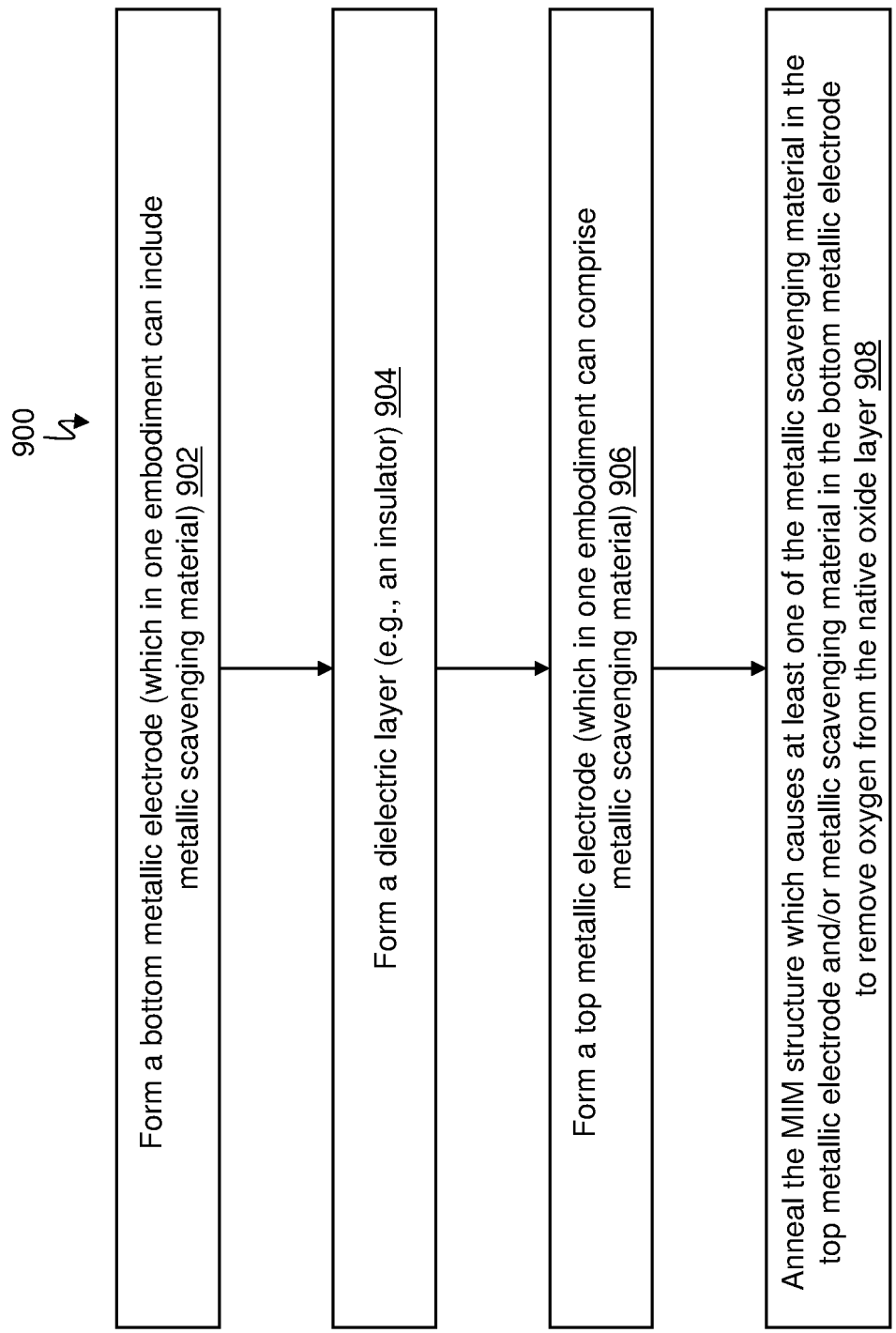

METAL INSULATOR METAL STRUCTURE WITH REMOTE OXYGEN SCAVENGING

BACKGROUND

Exemplary embodiments generally relate to metal stacks, and more specifically, to oxygen scavenging for metal stacks.

Metal-insulator-metal (MIM) capacitors have been extensively utilized in the fabrication of integrated circuits. A MIM capacitor typically includes a MIM capacitor dielectric situated between lower and upper metal plates, which form the electrodes of the MIM capacitor.

BRIEF SUMMARY

According to an exemplary embodiment, a structure includes a first metallic electrode, a dielectric film is formed over the first metallic electrode, and a second metallic electrode is formed over the dielectric film. The second metallic electrode includes an oxygen scavenging material. The oxygen scavenging material is selected such that an oxygen density decreases in a region between the first metallic electrode and the second metallic electrode responsive to elevating a temperature of the first metallic electrode, the dielectric film, and the second metallic electrode.

According to an exemplary embodiment, a structure includes a first metallic electrode, and the first metallic electrode includes an oxygen scavenging material. The structure includes a dielectric film formed over the first metallic electrode, and a second metallic electrode formed over the dielectric film. The oxygen scavenging material is selected such that an oxygen density decreases in a region between the first metallic electrode and the second metallic electrode responsive to elevating a temperature of the first metallic electrode, the dielectric film, and the second metallic electrode.

According to an exemplary embodiment, a method of forming a structure is provided. The method includes forming a dielectric film over a first metallic electrode, and forming a second metallic electrode over the dielectric film in which the second metallic electrode includes an oxygen scavenging material. The method includes elevating a temperature of the first metallic electrode, the dielectric film, and the second metallic electrode which causes an oxygen density to decrease in a region between the first metallic electrode and the second metallic electrode.

According to an exemplary embodiment, a method of forming a structure is provided. The method includes forming a dielectric film over a first metallic electrode, and the first metallic electrode includes an oxygen scavenging material. The method includes forming a second metallic electrode over the dielectric film, and elevating a temperature of the first metallic electrode, the dielectric film, and the second metallic electrode which causes an oxygen density to decrease in a region between the first metallic electrode and the second metallic electrode.

Additional features are realized through the techniques of the present disclosure. Other systems, methods, and/or apparatus according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

FIG. 9 illustrates a method for fabricating a metal-insulator-metal (MIM) structure according to an exemplary embodiment.

DETAILED DESCRIPTION

Metal-insulator-metal (MIM) structures, such as MIM capacitors, magnetic tunnel junctions (MTJ), or oxide-based resistive random access memory (RRAM), commonly require careful control of their oxygen depth profile, which sometimes includes removal of excess oxygen.

MIM capacitors often suffer from inadvertent oxidation of the bottom electrode due to air exposure and/or oxidizing conditions during insulator (i.e., dielectric) deposition, which may degrade the MIM capacitor's electrical properties. For example, because of inadvertent oxidation of the bottom electrode, the capacitance density of a MIM capacitor is reduced.

Also, the device characteristics of MTJ are impacted by oxidation of the bottom electrode. Additionally, oxide-based RRAM, whose characteristics depend critically on oxygen/vacancy chemistry within the oxide layer, often exhibits insufficient device properties.

One solution may be to include a metallic oxygen scavenging (gettering) layer at one of the electrode-dielectric interfaces (usually at the top electrode interface), which removes undesirable native oxides on the bottom electrode and/or partially reduces the insulating layer, depending on the application.

Exemplary embodiments instead use a remote oxygen scavenging element/layer inside one of the electrodes (and/or inside both electrodes, assuming there is a top and bottom electrode). As a technical benefit, this design removes the requirement for a scavenging layer at the top interface between the insulator and top electrode and also provides more flexibility in the choice of materials for the active MIM region. Further, exemplary embodiments provide more flexibility to design top electrode/dielectric interfaces because there does not need to be any metallic oxygen scavenging layer between the top electrode and the dielectric layer.

Figure 1:
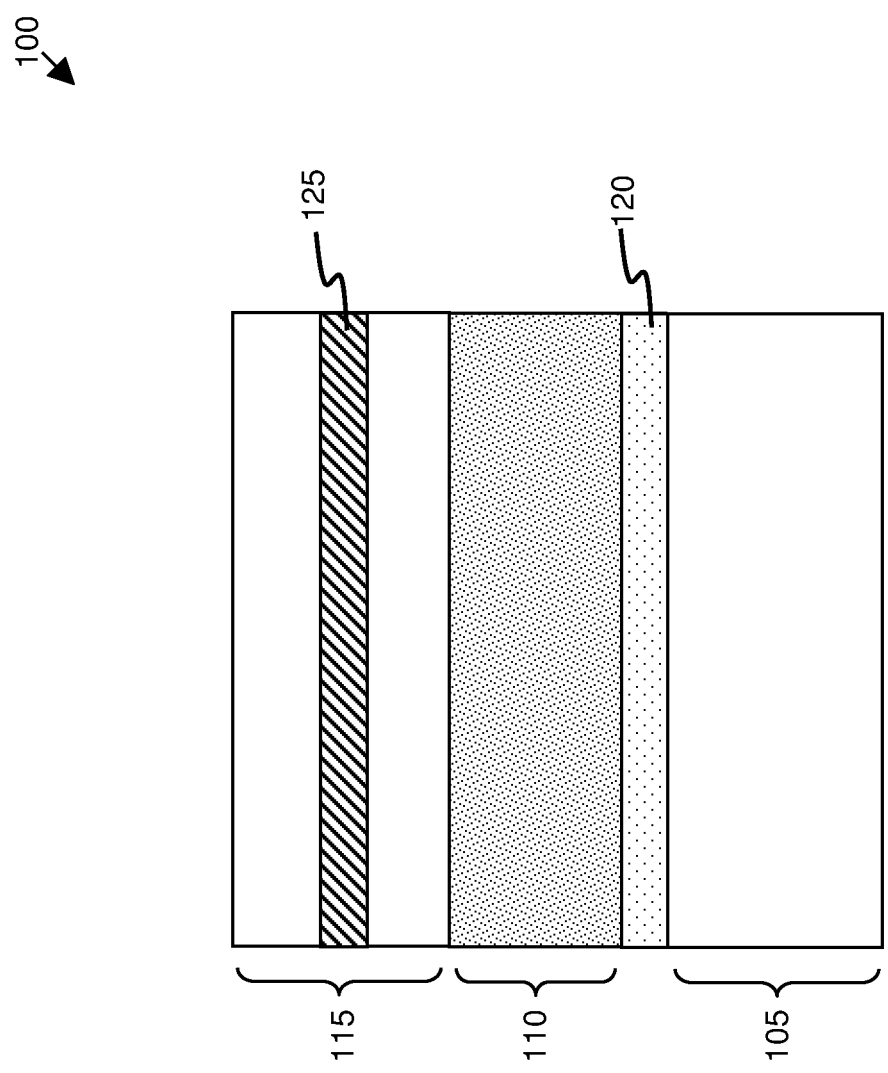
FIG. 1 is a cross-sectional view of a metal-insulator-metal (MIM) structure having oxygen scavenging material in a top electrode according to an exemplary embodiment.

Now turning to the figures, FIG. 1 depicts a cross-sectional view of a metal-insulator-metal structure (MIM) 100 in accordance with an exemplary embodiment.

In fabricating the MIM structure 100, a bottom metallic electrode 105 is formed. The bottom metallic electrode 105 may be a single element or compound material, and/or it may be a combination of several materials, such as a bilayer or multilayer stack. The material of the bottom metallic electrode 105 may be, e.g., titanium nitride (TiN). The bottom metallic electrode 105 may optionally be formed on a substrate (not shown) as understood by one skilled in the art.

A dielectric layer 110 may be formed on top of the bottom metallic electrode 105. The dielectric layer 110 may be a single compound material, and/or it may be a combination of several materials, such as a bilayer or multilayer stack. The material of the dielectric layer 110 may be, e.g., hafnium oxide ($HfO_2$). The dielectric layer 110 may act as an insulator. When forming the dielectric layer 110 on the bottom metallic electrode 105, a native oxide 120 may grow on the bottom metallic electrode 105. The native oxide 120 is the oxidation of the bottom metallic electrode 105 when depositing the hafnium oxide to form the dielectric layer 110. The native oxide 120 may be, e.g., $TiO_2$ or TiON when the bottom metallic electrode is titanium nitride. The native oxide 120 grows from the material of the bottom metallic electrode 105 and oxygen used to form the material of the dielectric layer 110; the native oxide 120 layer would comprise the material of the bottom metallic electrode 105 and oxygen.

A top metallic electrode 115 may be formed on top of the dielectric layer 110. The top metallic electrode 115 is formed so as to include at least one or more metallic scavenging layers 125. The material of the metallic scavenging layer 125 may be, e.g., aluminum (Al). One exemplary technique for forming the top metallic electrode 115 that includes the metallic scavenging layer 125 is by implanting aluminum ions into the top metallic electrode 115. Another exemplary technique for forming the top metallic electrode 115 infused with the metallic scavenging layer 125 is to (alternately) switch between disposing, e.g., a titanium nitride layer and disposing an aluminum layer until the top metallic electrode 115 is complete. Another exemplary technique for forming the top metallic electrode 115 infused with the metallic scavenging layer 125 is to dispose, e.g., titanium nitride, followed by simultaneously disposing, e.g., titanium nitride and aluminum and thus forming titanium aluminum nitride, until the top metallic electrode 115 is complete.

The material for the top metallic electrode 115 (including top metallic electrode 715) and the bottom metallic electrode 105 (including bottom metallic electrode 405) may be selected from, but is not limited to, Pt, TiN, TiC, TaN, TaC, CoFeB, as well as combinations thereof. The metallic scavenging layer 125 may be selected from, but is not limited to, Al, Be, Mg, Ca, Sr, Ba, Sc, Y, La, Ti, Zr, Hf, Dy, Lu, Er, Pr, and Ce, as well as combinations thereof. Also, the layers of the MIM structure 100 (and MIM structures 400 and 700) may be formed, for example, by chemical vapor deposition (CVD), physical vapor deposition (PVD), atomic layer deposition (ALD), and/or other techniques known in the art.

Figure 2:
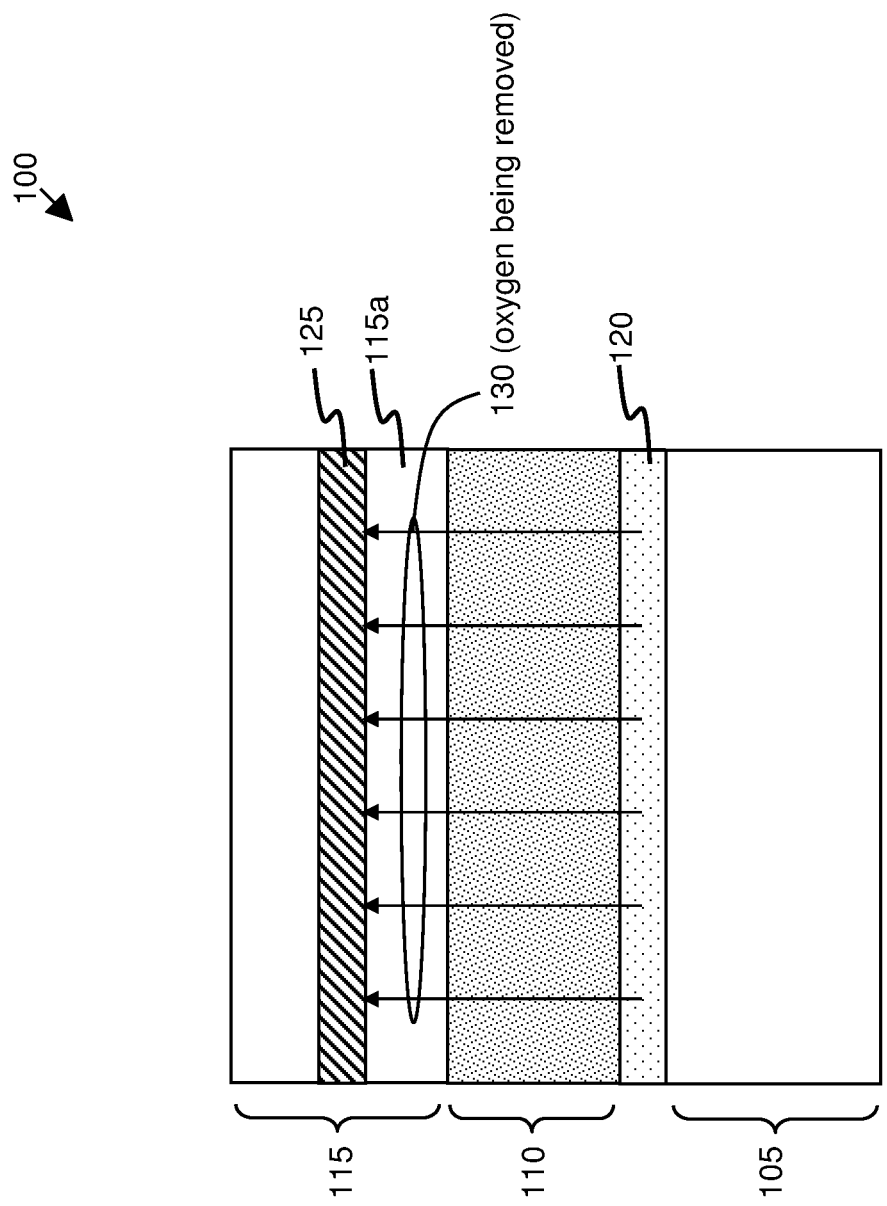
FIG. 2 is a cross-sectional view of annealing a metal-insulator-metal (MIM) structure to remove oxygen in one direction according to an exemplary embodiment.

FIG. 2 illustrates annealing the MIM structure 100 to remove the native oxide 120 (layer) according to an exemplary embodiment. For the metallic scavenging layer 125, the Gibbs free energy change (Equation 1) for the reaction, $x \cdot m$ $S + y\ E_nO_m \rightarrow m\ S_xO_y + y \cdot n\ E$, may be negative.

S=the scavenging element (e.g., such as Al, which may be the material of the metallic scavenging layer 125), E=the element (metal) that is initially oxidized, its oxide having stoichiometry $E_nO_m$, and is being reduced during the anneal (e.g. a metal element comprised by the native oxide 120), and O=oxygen. Also, x denotes #amount of atoms or #amount of moles, m denotes #amount of atoms or #amount of moles, y denotes #amount of atoms or #amount of moles, and n denotes #amount of atoms or #amount of moles. Also, $x \cdot m$ denotes x multiplied by m, and $y \cdot n$ denotes y multiplied by n.

A negative Gibbs free energy change in Equation 1 implies that the reduction of element E and simultaneous oxidation of scavenging element S is favorable based on bulk thermodynamics. For example, the Gibbs free energy change for the reaction $4Al + 3TiO_2 \rightarrow 2Al_2O_3 + 3Ti$ is negative, suggesting that Al is an appropriate scavenging element for removing native oxides from a titanium nitride bottom electrode. However, appropriate scavenging elements are not limited to those predicted by bulk thermodynamics.

An anneal process is applied to the MIM structure 100. The anneal process is a heat treatment that alters the microstructure of a material. During the anneal process, the MIM structure 100 is heated to elevate its temperature. By annealing the MIM structure 100, this initiates the oxygen scavenging process of the metallic scavenging layer 125 in which the metallic scavenging layer 125 removes oxygen atoms from the native oxide 120. The arrows 130 illustrate oxygen being removed from and/or attracted to the top metallic electrode 115. Although the arrows 130 show the material of the metallic scavenging layer 125 scavenging oxygen impurities from the native oxide 120, the metallic scavenging layer 125 can remove oxygen impurities from other areas in the MIM structure 100. During the scavenging process, there is a net flow of oxygen to the metallic scavenging layer 125 (formed within the top metallic electrode 115), and the oxygen from the native oxide 120 oxidizes the metallic scavenging layer 125. Accordingly, the material of the metallic scavenging layer 125 may change from Al to $Al_xO_y$ after the oxygen scavenging process is completed. As mentioned above, the metallic scavenging layer 125 may be multiple layers formed within the top metallic electrode 115. Also, the metallic scavenging layer 125 may represent the metallic scavenging material (e.g., Al) dispersed throughout the top metallic electrode 115, and the oxygen atoms (i.e., ions) attach to the metallic scavenging material dispersed throughout the top metallic electrode 115.

Further, in accordance with an exemplary embodiment, the oxygen scavenging material of the metallic scavenging layer 125 may not be in direct contact with the dielectric layer 110. For example, the dielectric layer 110 may not (physically) touch (i.e., contact) the metallic scavenging layer 125 because the metallic scavenging layer 125 is remote from the dielectric layer 110. There may be intervening metal 115a (e.g., such as the metal forming the top metallic electrode 115) directly separating (i.e., intervening between) the dielectric layer 110 from the metallic scavenging layer 125. In which case, oxygen (shown by arrows 130) travels through the intervening metal 115a forming the top metallic electrode 115 to reach (oxidize) the metallic scavenging layer 125.

Figure 3:
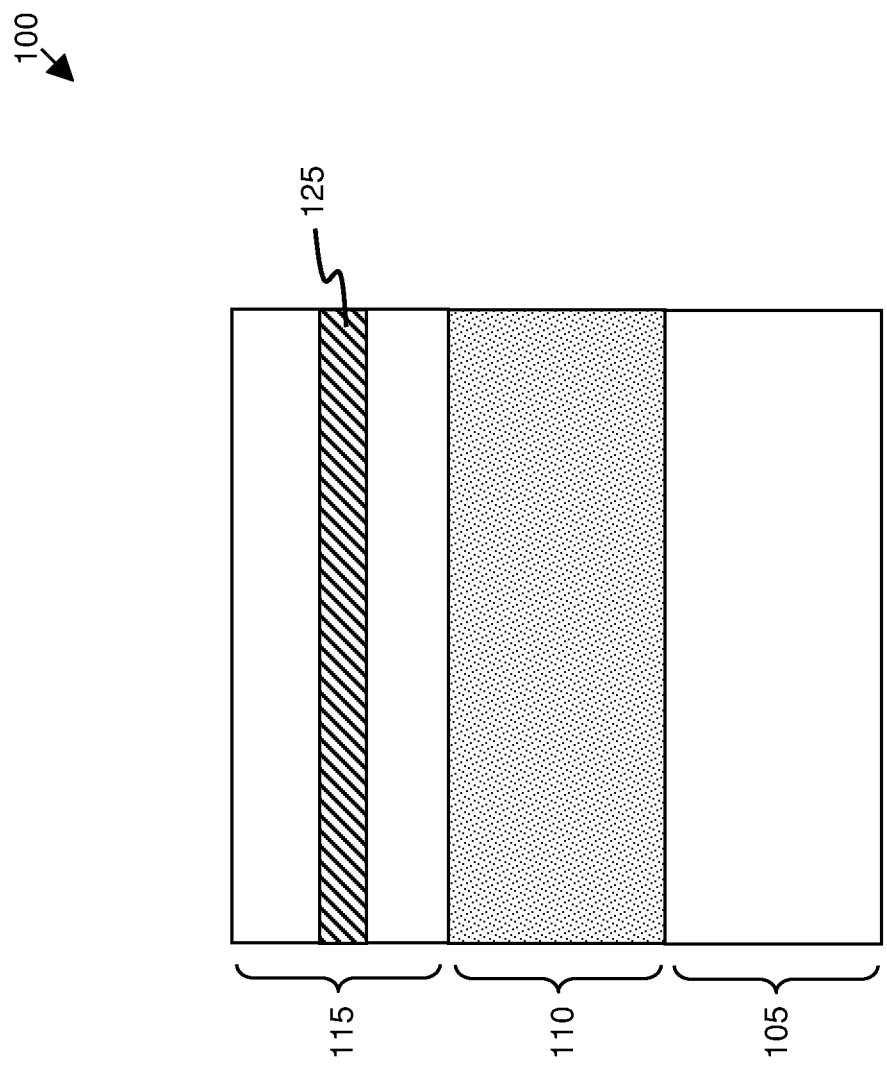
FIG. 3 is a cross-sectional view of a metal-insulator-metal (MIM) structure having oxygen scavenging material in a top electrode after annealing according to an exemplary embodiment.

FIG. 3 depicts the cross-sectional view of the MIM structure 100 after the anneal process according to an exemplary embodiment. In FIG. 3, the native oxide 120 is completely and/or partially removed, and the native oxide 120 (layer) is not shown. The metallic scavenging layer 125 (formed within the top metallic electrode 115) has now been oxidized.

Figure 4:
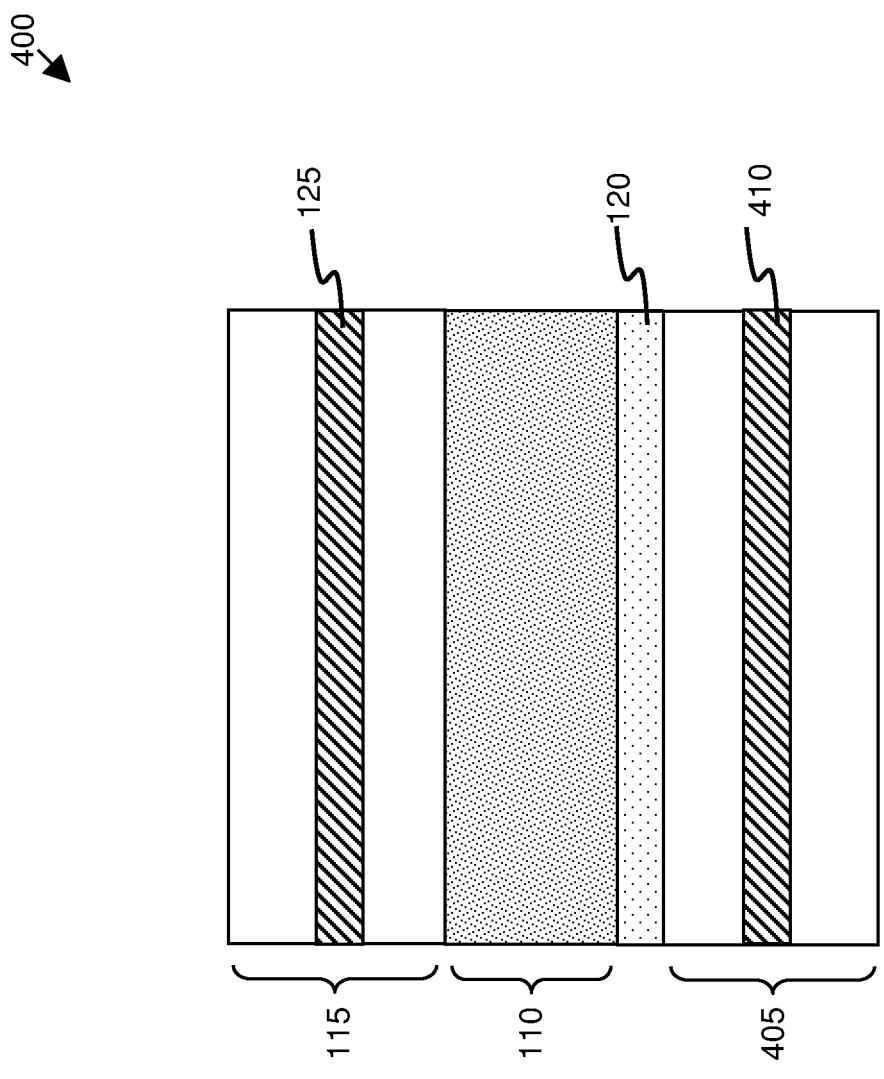
FIG. 4 is a cross-sectional view of a metal-insulator-metal (MIM) structure having oxygen scavenging material in both a top and bottom electrode according to an exemplary embodiment.

According to another exemplary embodiment, FIG. 4 depicts a cross-sectional view of a MIM structure 400 comprising a scavenging metallic layer in both a top and bottom metallic electrode 115 and 405.

In fabricating the MIM structure 400, the bottom metallic electrode 405 is formed. As discussed above, the material of the bottom metallic electrode 405 may be, e.g., titanium nitride (TiN), and the bottom metallic electrode 405 may optionally be formed on a substrate (not shown) as understood by one skilled in the art.

Additionally, the bottom metallic electrode 405 is formed so as to include at least one or more metallic scavenging layers 410 (which can be the same as the metallic scavenging layers 125 shown in the MIM structure 100). The material of the metallic scavenging layer 410 may be, e.g., aluminum (Al). As such, the bottom metallic electrode 405 may be formed so as to include the metallic scavenging layer 410 as discussed herein for the MIM structure 100.

The dielectric layer 110 may be formed on top of the bottom metallic electrode 405 in FIG. 4. The material of the dielectric layer 110 may be, e.g., hafnium oxide ($HfO_2$) and act as an insulator. Similarly, as discussed above, when forming the dielectric layer 110 on the bottom metallic electrode 405, the native oxide 120 may grow on the bottom metallic electrode 405. The native oxide 120 is the oxidation of the bottom metallic electrode 405 when disposing the hafnium oxide to form the dielectric layer 110. The native oxide 120 may be, e.g., $TiO_2$ or TiON.

The top metallic electrode 115 may be formed on top of the dielectric layer 110, and the top metallic electrode 115 is formed to comprise the metallic scavenging layer 125 (as discussed for the MIM structure 100). Now, for the MIM structure 400, the bottom metallic electrode 405 includes the metallic scavenging layer 410 and the top metallic electrode 115 includes the metallic scavenging layer 125. The metallic scavenging layer 410 and the metallic scavenging layer 125 may be the same material, and/or they may be different materials.

Figure 5:
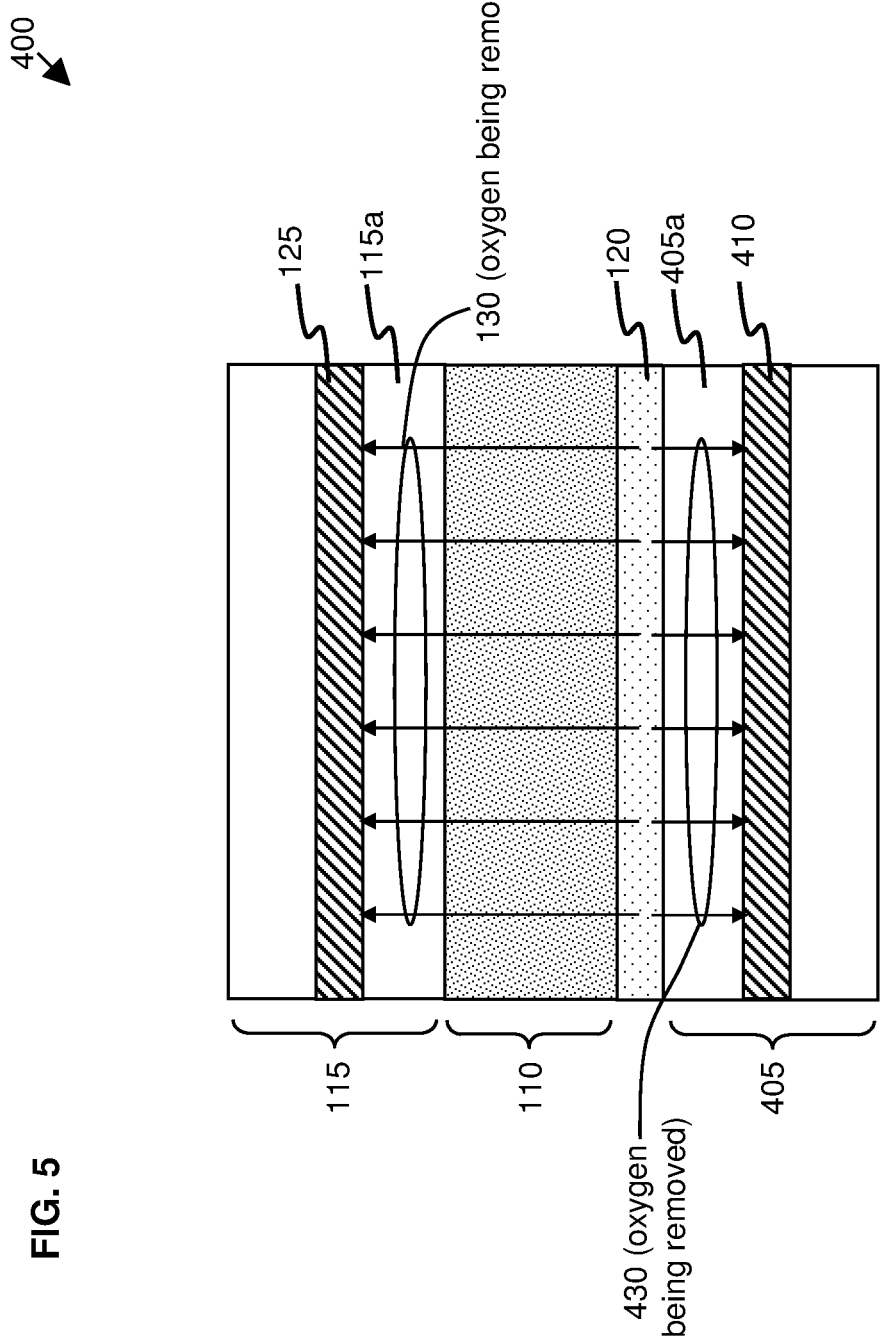
FIG. 5 is a cross-sectional view of annealing a metal-insulator-metal (MIM) structure to remove oxygen in both directions according to an exemplary embodiment.

Similar to FIG. 2, FIG. 5 illustrates annealing the MIM structure 400 to remove the native oxide 120 (layer) according to an exemplary embodiment. However, in this case, the Gibbs free energy change (Equation 1) reaction applies for both the metallic scavenging layer 125 (in the top metallic electrode 115) and the metallic scavenging layer 410 (in the bottom metallic electrode 405). As such, for one or both of the metallic scavenging layers 125 and 410, the Gibbs free energy change (Equation 1) for the reaction, $x \cdot m$ S+y $E_nO_m \rightarrow m$ $S_xO_y$+y·n E, may be negative.

S=the scavenging element (e.g., such as Al, in both the top metallic electrode 115 and/or the bottom metallic electrode 405, respectively), E=the element (metal) that is initially oxidized (its (E) oxide having stoichiometry $E_nO_m$ and its oxide is being reduced during the anneal (e.g. a metal element comprised by the native oxide 120)), O=oxygen. Also, x denotes #amount of atoms or #amount of moles, m denotes #amount of atoms or #amount of moles, y denotes #amount of atoms or #amount of moles, and n denotes #amount of atoms or #amount of moles.

By annealing the MIM structure 400 to elevate its temperature, this initiates the oxygen scavenging process of the metallic scavenging layers 125 and 410 in which both metallic scavenging layers 125 and 410 remove oxygen atoms from the native oxide 120. The arrows 130 illustrate net oxygen flux to the top metallic electrode 115 (as discussed for the MIM structure 100). For example, the oxygen from the native oxide 120 oxidizes the metallic scavenging layer 125. Simultaneously, the arrows 430 illustrate net oxygen flux to the bottom metallic electrode 405. For example, the oxygen from the native oxide 120 oxidizes the metallic scavenging layer 410 in the bottom metallic electrode 405.

Accordingly, the material of metallic scavenging layers 125 and 410 may change from Al to $Al_xO_y$ after the oxygen scavenging process. As mentioned above, the metallic scavenging layer 125 may be multiple layers formed within the top metallic electrode 115, and the metallic scavenging layer 410 may be multiple layers formed within the bottom metallic electrode 405. Also, the metallic scavenging layer 125 and 410 may be the metallic scavenging material (e.g., Al) dispersed throughout the top metallic electrode 115 and the bottom metallic electrode 405, respectively.

Having metallic scavenging layers 125 and 410 in both top and bottom metallic electrodes 115 and 405 may, e.g., result in more oxygen being removed from the native oxide layer 120. There may be a case in which the dielectric layer 110 (itself) conducts oxygen poorly. In such a case, it may be beneficial for the scavenging bottom metallic electrode 405 to remove oxygen from the bottom interface (i.e., the interface between the bottom metallic electrode 405 and the dielectric layer 110), and the scavenging top metallic electrode 115 to remove oxygen from the top interface (i.e., the interface between the top metallic electrode 115 and the dielectric layer 110).

Additionally, in accordance with an exemplary embodiment, the oxygen scavenging material of the oxygen metallic scavenging layer 125, 410 may not be in direct contact with the dielectric layer 110. As discussed above, the dielectric layer 110 may not (physically) touch (i.e., contact) the oxygen metallic scavenging layer 125, 410 because the oxygen metallic scavenging layer 125, 410 is remote from the dielectric layer 110. There may be intervening metal 115a (e.g., such as the metal forming the top metallic electrode 115) and intervening metal 405a (e.g., such as the metal forming the bottom metallic electrode 405) directly separating (i.e., intervening between) the dielectric layer 110 from the oxygen metallic scavenging layer 125 and 410, respectively. In which case, oxygen (shown by arrows 130) travels through the intervening metal 115a forming the top metallic electrode 115 to reach (oxidize) the oxygen metallic scavenging layer 125 and oxygen (shown by arrows and 430) travels through the intervening metal 405a forming the bottom metallic electrode 405 to reach (oxidize) the oxygen metallic scavenging layer 410.

Figure 6:
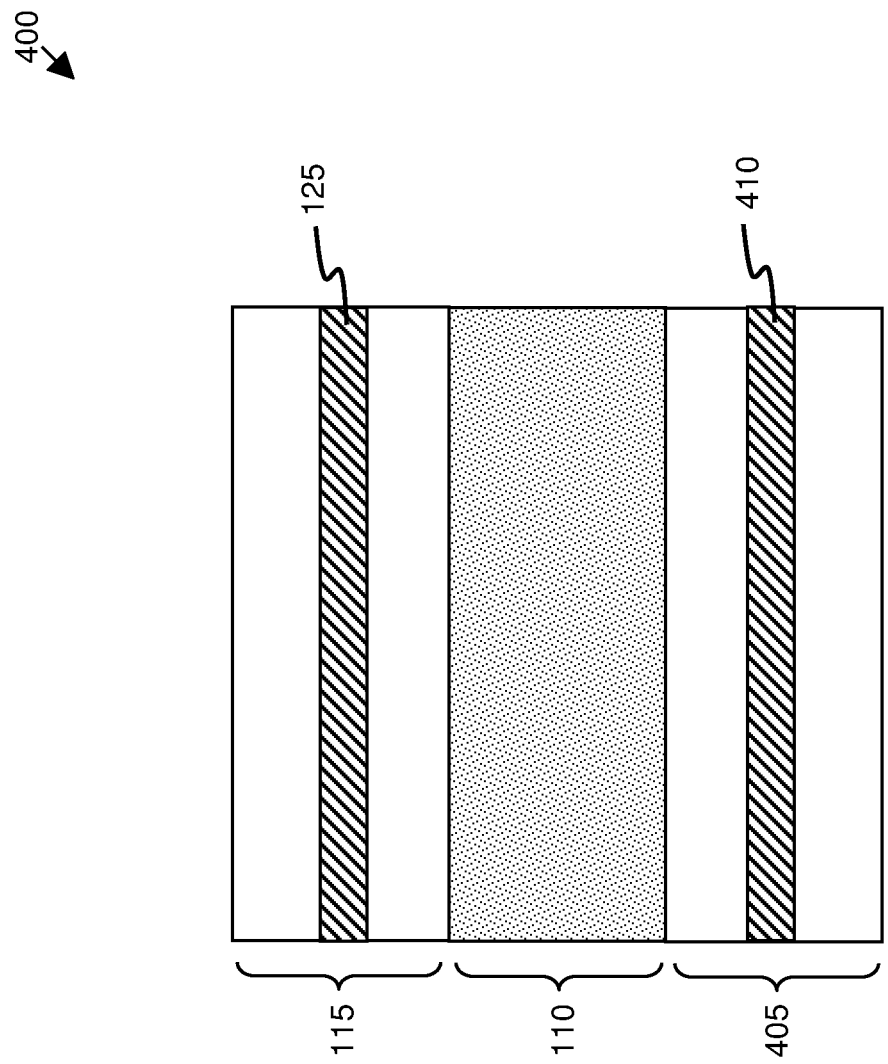
FIG. 6 is a cross-sectional view of a metal-insulator-metal (MIM) structure having oxygen scavenging material in both a top and bottom electrode after annealing according to an exemplary embodiment.

FIG. 6 depicts a cross-sectional view of the MIM structure 400 after the anneal process according to an exemplary embodiment. In FIG. 6, the native oxide 120 is completely and/or partially removed, and accordingly, the native oxide 120 (layer) is not shown. The metallic scavenging layer 125 formed within the top metallic electrode 115 and the metallic scavenging layer 410 formed within the bottom metallic electrode 405 have now been oxidized.

Figure 7:
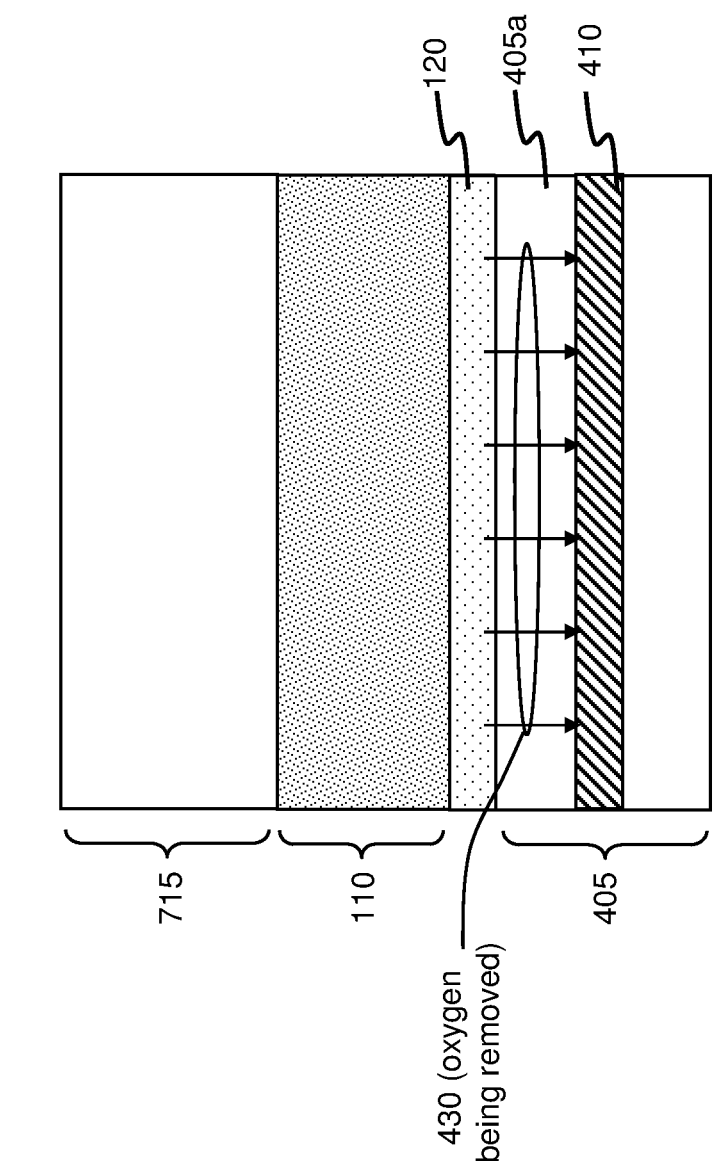
FIG. 7 is a cross-sectional view of a metal-insulator-metal (MIM) structure having oxygen scavenging material in a bottom electrode according to an exemplary embodiment.

FIG. 7 depicts a cross-sectional view of a MIM structure 700 according to an exemplary embodiment. In the MIM structure 700, the bottom metallic electrode 405 comprises the metallic scavenging layer 410 but a top metallic electrode 715 does not include a metallic scavenging layer.

In fabricating the MIM structure 700, the bottom metallic electrode 405 is formed, and as discussed above, the bottom metallic electrode 405 is formed to comprise at least one or more metallic scavenging layers 410.

The dielectric layer 110 (e.g., hafnium oxide ($HfO_2$)) may be formed on top of the bottom metallic electrode 405 in FIG. 7, which can cause the native oxide 120 to grow on the bottom metallic electrode 405 (as discussed herein).

Figure 8:
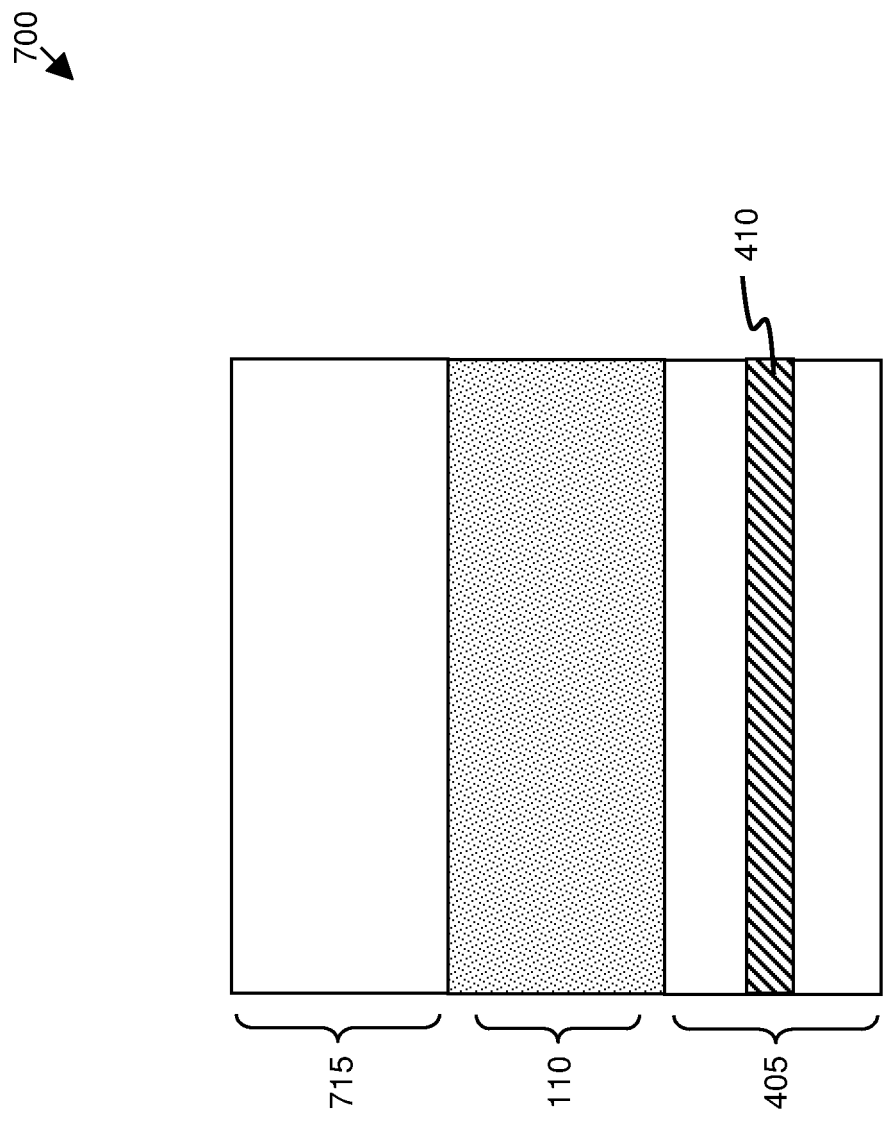
FIG. 8 is a cross-sectional view of a metal-insulator-metal (MIM) structure having oxygen scavenging material in a bottom electrode after annealing according to an exemplary embodiment.

The top metallic electrode 115 may be formed on top of the dielectric layer 110, and the top metallic electrode 115 (in this case) does not comprise the metallic scavenging layer (unlike the MIM structures 100 and 400). Also, the location of the metallic scavenging layer 410 in the MIM structure 700 is the reverse of the metallic scavenging layer 125 in the MIM structure 100. During the annealing process of the MIM structure 700, the oxygen atoms are removed from the native oxide 120 to the metallic scavenging layer 410 (in the bottom metallic electrode 405) as shown by the down arrows 430. After completing the annealing process, the metallic scavenging layer 410 in the MIM structure 700 is oxidized by the received oxygen atoms, and the native oxide 120 (layer) is removed as shown in FIG. 8.

The MIM structures 100, 400, 700 allow metal-insulator-metal devices to have remote oxygen (metallic) scavenging elements/layer(s) inside one or more electrodes. This removes any need to insert a separate metallic scavenging layer between, e.g., the top metallic electrode 115, 715 and the dielectric layer 110, and removes any need to insert a separate metallic scavenging layer between, e.g., the dielectric layer 110 and the bottom metallic electrode 105, 405.

FIG. 9 illustrates a method 900 for fabricating the MIM structures 100, 400, 700 (i.e., MIM electronic devices) as shown in FIGS. 1-8 according to an exemplary embodiment.

The bottom metallic electrode 105, 405 (which can include metallic scavenging layer 410, i.e., scavenging material) is disposed (block 902), and the dielectric layer 110 is disposed on the bottom metallic electrode 105, 405, (block 904). Disposing the dielectric layer 110 can cause the native oxide 120 to grow on the bottom metallic electrode 105, 405. The top metallic electrode 115, 715 (which can include metallic scavenging layer 125, i.e., scavenging material) is disposed on the dielectric layer 110 (block 906).

The MIM structure 100, 400, 700 is annealed to cause at least one of the metallic scavenging layer 125 (i.e., scavenging material) in the top metallic electrode 115 and/or metallic scavenging layer 410 (i.e., scavenging material) in the bottom metallic electrode 405 to remove oxygen from the native oxide 120 layer (block 908).

For example, the oxygen density decreases in a region (e.g., the native oxide 120 layer and any other area that comprises oxygen in the MIM structure 100, 400, 700) between the bottom metallic electrode 105, 405 and the top metallic electrode 115, 715 responsive to elevating a temperature of the bottom metallic electrode 105, 405, the dielectric layer (i.e., dielectric film) 110, and the top metallic electrode 115, 715. The annealing may occur in, e.g., a furnace or in a rapid thermal annealing chamber.

Also, an oxygen density increases in the oxygen metallic scavenging layer 125 and/or the oxygen metallic scavenging layer 410 (while the oxygen density in the native oxide 120 layer decreases) responsive to elevating the temperature of the bottom metallic electrode 105, 405, the dielectric layer 110 (film), and the top metallic electrode 115, 715.

It is understood that any of the layers (i.e., films) 105, 110, 115, 120, 125, 405, 410, 715 may be patterned before or after annealing.

The metal-insulator-metal (MIM) structures 100, 400, 700 discussed herein may be utilized in a circuit (or electronic device) as understood by one skilled in the art. The MIM structures 100, 400, 700 may be utilized in circuits for MIM capacitors, magnetic tunnel junctions (MTJ), and resistive random access memory (RAM) as understood by one skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A structure, comprising:
    a bottom metallic electrode;
    a dielectric film formed over the bottom metallic electrode;
    a top metallic electrode formed over and touching the dielectric film, the top metallic electrode comprising an oxygen scavenging material;
    wherein the oxygen scavenging material is a film formed in a longitudinal direction in the top metallic electrode;
    wherein in the top metallic electrode, the oxygen scavenging material is oxygen scavenging while any remaining material in the top metallic electrode is not oxygen scavenging;
    an oxygen region formed at an interface of the bottom metallic electrode and the dielectric film, the top metallic electrode being remote from and not touching the oxygen region;
    wherein the oxygen scavenging material is selected such that an oxygen density decreases in the oxygen region between the bottom metallic electrode and the top metallic electrode responsive to elevating a temperature of the bottom metallic electrode, the dielectric film, and the top metallic electrode; and
    an oxidized oxygen scavenging material formed in the top metallic electrode from the oxygen scavenging material, responsive to elevating the temperature which decreases the oxygen density in the oxygen region at the interface of the bottom metallic electrode and the dielectric film.

2. The structure of claim 1, wherein the oxygen scavenging material is not in direct contact with the dielectric film;

wherein the oxidized oxygen scavenging material is formed from a combination of oxygen from the oxygen density and the oxygen scavenging material.

3. The structure of claim 1, wherein the oxygen density increases in the oxygen scavenging material responsive to elevating the temperature of the bottom metallic electrode, the dielectric film, and the top metallic electrode.

4. The structure of claim 1, wherein the top metallic electrode is disposed above the bottom metallic electrode.

5. The structure of claim 1, wherein the bottom metallic electrode comprises another oxygen scavenging material.

6. The structure of claim 5, wherein another oxygen density increases in the another oxygen scavenging material responsive to elevating the temperature of the bottom metallic electrode, the dielectric film, and the top metallic electrode.

7. The structure of claim 6, wherein the oxygen scavenging material is disposed opposed to the another oxygen scavenging material.

8. The structure of claim 7, wherein the oxygen scavenging material extracts oxygen from the oxygen region in a first direction; and
wherein the another oxygen scavenging material extracts oxygen from the oxygen region in a second direction opposing the first direction.

9. A structure comprising:
a bottom metallic electrode, the bottom metallic electrode comprising an oxygen scavenging material;
a dielectric film formed over the bottom metallic electrode; and
a top metallic electrode formed over the dielectric film;
wherein the oxygen scavenging material is a film formed in a longitudinal direction in the bottom metallic electrode;
wherein in the bottom metallic electrode, the oxygen scavenging material is oxygen scavenging while any remaining material in the bottom metallic electrode is not oxygen scavenging;
an oxygen region formed at an interface of the bottom metallic electrode and the dielectric film;
wherein the oxygen scavenging material is selected such that an oxygen density decreases in the oxygen region between the bottom metallic electrode and the top metallic electrode responsive to elevating a temperature of the bottom metallic electrode, the dielectric film, and the top metallic electrode; and
an oxidized oxygen scavenging material formed in the bottom metallic electrode from the oxygen scavenging material, responsive to elevating the temperature which decreases the oxygen density in the oxygen region at the interface of the bottom metallic electrode and the dielectric film.

10. The structure of claim 9, wherein the oxygen scavenging material is not in direct contact with the dielectric film.

11. The structure of claim 9, wherein the oxygen density increases in the oxygen scavenging material responsive to elevating the temperature of the bottom metallic electrode, the dielectric film, and the top metallic electrode.

12. The structure of claim 9, wherein the bottom metallic electrode is disposed below the top metallic electrode.

13. The structure of claim 9, wherein the top metallic electrode comprises another oxygen scavenging material; and
wherein another oxygen density increases in the another oxygen scavenging material responsive to elevating the temperature of the bottom metallic electrode, the dielectric film, and the top metallic electrode.

14. A method of forming a structure, the method comprising:
forming a dielectric film over a bottom metallic electrode;
forming a top metallic electrode over and touching the dielectric film, the top metallic electrode comprising an oxygen scavenging material;
wherein the oxygen scavenging material is a film formed in a longitudinal direction in the top metallic electrode;
wherein in the top metallic electrode, the oxygen scavenging material is oxygen scavenging while any remaining material in the top metallic electrode is not oxygen scavenging;
wherein an oxygen region is formed at an interface of the bottom metallic electrode and the dielectric film, the top metallic electrode being remote from and not touching the oxygen region; and
elevating a temperature of the bottom metallic electrode, the dielectric film, and the top metallic electrode which causes an oxygen density to decrease in the oxygen region between the bottom metallic electrode and the top metallic electrode;
wherein an oxidized oxygen scavenging material is formed in the top metallic electrode from the oxygen scavenging material, responsive to elevating the temperature which decreases the oxygen density in the oxygen region at the interface of the bottom metallic electrode and the dielectric film.

15. The method of claim 14, wherein the oxygen scavenging material is not in direct contact with the dielectric film.

16. The method of claim 14, wherein the oxygen density increases in the oxygen scavenging material responsive to elevating the temperature of the bottom metallic electrode, the dielectric film, and the top metallic electrode.

17. The method of claim 14, wherein the top metallic electrode is disposed above the bottom metallic electrode.

18. The method of claim 14, wherein the bottom metallic electrode comprises another oxygen scavenging material.

19. The method of claim 18, wherein another oxygen density increases in the another oxygen scavenging material responsive to elevating the temperature of the bottom metallic electrode, the dielectric film, and the top metallic electrode.

20. The method of claim 19, wherein the oxygen scavenging material is disposed opposed to the another oxygen scavenging material;
wherein the oxygen scavenging material extracts oxygen from the oxygen region in a first direction; and
wherein the another oxygen scavenging material extracts oxygen from the oxygen region in a second direction opposing the first direction.

21. A method of forming a structure, the method comprising:
forming a dielectric film over a bottom metallic electrode, the bottom metallic electrode comprising an oxygen scavenging material;
forming a top metallic electrode over the dielectric film;
wherein the oxygen scavenging material is a film formed in a longitudinal direction in the bottom metallic electrode;
wherein in the bottom metallic electrode, the oxygen scavenging material is oxygen scavenging while any remaining material in the bottom metallic electrode is not oxygen scavenging;
wherein an oxygen region is formed at an interface of the bottom metallic electrode and the dielectric film; and
elevating a temperature of the bottom metallic electrode, the dielectric film, and the top metallic electrode which causes an oxygen density to decrease in the oxygen region between the bottom metallic electrode and the top metallic electrode;

wherein an oxidized oxygen scavenging material is formed in the bottom metallic electrode from the oxygen scavenging material, responsive to elevating the temperature which decreases the oxygen density in the oxygen region at the interface of the bottom metallic electrode and the dielectric film.

22. The method of claim 21, wherein the oxygen scavenging material is not in direct contact with the dielectric film.

23. The method of claim 21, wherein the oxygen density increases in the oxygen scavenging material responsive to elevating the temperature of the bottom metallic electrode, the dielectric film, and the top metallic electrode.

24. The method of claim 21, wherein the bottom metallic electrode is disposed below the top metallic electrode;

wherein the top metallic electrode comprises another oxygen scavenging material; and wherein another oxygen density increases in the another oxygen scavenging material responsive to elevating the temperature of the bottom metallic electrode, the dielectric film, and the top metallic electrode.

\* \* \* \* \*